United States Patent
Ding et al.

(10) Patent No.: US 12,406,937 B2
(45) Date of Patent: Sep. 2, 2025

(54) ALIGNMENT METHOD FOR BACKSIDE PHOTOLITHOGRAPHY PROCESS

(71) Applicant: SHENZHEN RUBEUST TECHNOLOGY LIMITED, Guangdong (CN)

(72) Inventors: Xinqi Ding, Guangdong (CN); Jiarui Ai, Guangdong (CN); Wang Jiao, Guangdong (CN); Chao-chen Cheng, Guangdong (CN)

(73) Assignee: SHENZHEN RUBEUST TECHNOLOGY LIMITED, Guangdong (CN)

( * ) Notice: Subject to any disclaimer, the term of this patent is extended or adjusted under 35 U.S.C. 154(b) by 322 days.

(21) Appl. No.: 17/640,814

(22) PCT Filed: Nov. 20, 2020

(86) PCT No.: PCT/CN2020/130610
§ 371 (c)(1),
(2) Date: Mar. 5, 2022

(87) PCT Pub. No.: WO2021/098849
PCT Pub. Date: May 27, 2021

(65) Prior Publication Data
US 2022/0336368 A1    Oct. 20, 2022

(30) Foreign Application Priority Data
Nov. 22, 2019 (CN) .......................... 201911154536.8

(51) Int. Cl.
*H01L 23/544* (2006.01)
*G03F 9/00* (2006.01)
*H01L 21/304* (2006.01)

(52) U.S. Cl.
CPC .......... *H01L 23/544* (2013.01); *G03F 9/7046* (2013.01); *G03F 9/708* (2013.01); *H01L 21/304* (2013.01); *H01L 2223/54426* (2013.01)

(58) Field of Classification Search
CPC ...................................................... H01L 23/544
See application file for complete search history.

(56) References Cited

U.S. PATENT DOCUMENTS 5,024,953 A * 6/1991 Uematsu ............. H01L 31/0547
257/E23.179
5,580,831 A * 12/1996 Roman ................. H01L 23/544
257/E29.022
(Continued)

FOREIGN PATENT DOCUMENTS

| CN | 101174610 A | 5/2008 |
| CN | 103488064 A | 1/2014 |

(Continued)

OTHER PUBLICATIONS

International Search Report for corresponding PCT Application No. PCT/CN2020/130610, mailed Feb. 22, 2021.
(Continued)

*Primary Examiner* — Peter Bradford
(74) *Attorney, Agent, or Firm* — Tarolli, Sundheim, Covell & Tummino LLP

(57) ABSTRACT

The present application provides an alignment method for backside photolithography process of the wafer, the alignment method includes: cutting the wafer, and using at least two edges formed by cutting as the first alignment mark; bonding the front side of the wafer to the wafer pad to form a composite wafer; aligning the first alignment mark with the corresponding second alignment mark on the photomask for backside photolithography. This method is not limited by wafer thickness and material, and reduces the secondary input of the photolithography equipment; meanwhile, the
(Continued)

probability of fragments of thin wafers in the photolithography process can be reduced, and the yield of the product is effectively improved.

9 Claims, 4 Drawing Sheets

(56) References Cited

U.S. PATENT DOCUMENTS

| | | | | |
|---|---|---|---|---|
| 2001/0049256 | A1* | 12/2001 | Arai | .......... H01L 21/67132 |
| | | | | 451/289 |
| 2006/0249859 | A1* | 11/2006 | Eiles | ............ H01L 24/94 |
| | | | | 257/E23.179 |
| 2015/0357287 | A1 | 12/2015 | Lai et al. | |

FOREIGN PATENT DOCUMENTS

| | | | | |
|---|---|---|---|---|
| CN | 104078405 | A | | 10/2014 |
| CN | 104979331 | A | | 10/2015 |
| CN | 105225996 | A | * | 1/2016 |
| CN | 205910497 | U | | 1/2017 |
| JP | 2001345300 | A | * | 12/2001 ........... B24B 41/061 |

OTHER PUBLICATIONS

First Office Action dated Apr. 30, 2025 in the corresponding Chinese Application No. 201911154536.8.

\* cited by examiner

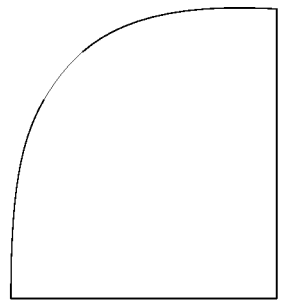

FIG. 6

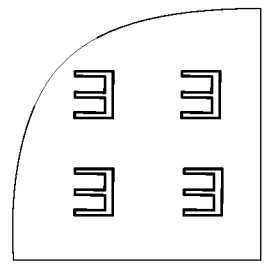

FIG. 7

| Acquiring a plurality of distance reference values, the distance reference value being a vertical distance value from a first preset position of the pattern on the photomask to the second alignment marks; and | S200 |

| Taking the second preset position as a starting point, determining a plurality of cutting points on the wafer according to a plurality of reference distances, and then connecting the plurality of cutting points to form at least two preset cutting lines; wherein, the second preset position is a position of the pattern on the wafer corresponding to the first preset position | S201 |

FIG. 8

ALIGNMENT METHOD FOR BACKSIDE PHOTOLITHOGRAPHY PROCESS

The present application is a national stage of International Application No. PCT/CN2020/130610, filed on Nov. 20, 2020, which claims priority to Chinese Patent Application No. 201911154536.8, filed on Nov. 22, 2019, and entitled with "ALIGNMENT METHOD FOR BACKSIDE PHOTOLITHOGRAPHY PROCESS". Both of the aforementioned applications are incorporated herein by reference in their entireties.

TECHNICAL FIELD

The present disclosure relates to the technical field of preparing semiconductor devices, and particularly, to an alignment method for a backside photolithography process.

BACKGROUND

In a wafer processing process, backside of a wafer is often required to photo-etch, but it needs to be aligned with a pattern on the front side of the wafer before photolithography backside of the wafer.

At present, in order to achieve precise alignment between the pattern on the front side of the wafer and the pattern on the backside of the wafer, an infrared double-side alignment technology is generally used. That is, the patterned front side of the wafer is allowed to face down, and the backside of the wafer opposite to the front side is allowed to face up, and then a set of infrared light sources is placed at the bottom of the wafer, and a set of infrared microscopes is placed at the top of the wafer. Infrared rays can penetrate the wafer. The light transmittance is different due to the different concave and convex shapes at the front side of the wafer, such that Infrared rays can map the pattern of the front side of the wafer to the backside of the wafer, and then the mapped pattern can be observed through an infrared microscope. Finally, the positions of the wafer and the photolithography plate are adjusted to achieve the alignment between the front side pattern and the backside pattern of the wafer. However, this technology is only suitable for thin wafers. When the thickness of the wafer exceeds a certain value, it is difficult to observe clear patterns, and some wafer materials cannot be penetrated by infrared rays. For this purpose, a new bottom alignment technology is adopted to achieve the alignment between the front side pattern and the backside pattern of the wafer. In particular, a set of microscopes are arranged under the photolithography plate, and image to the computer system by the camera. In a specific operation process, firstly, the bottom camera shoots the pattern on the photolithography plate, and the position information of the pattern on the photolithography plate is recorded by a computer, and then the wafer is moved face down to be located between the bottom camera and the photolithography plate. Similarly, the pattern of the front side of the wafer can be observed by the bottom camera. Then the wafer position is adjusted to align the pattern on the front side of the wafer with the pattern retained on the photolithography plate, that is, the backside photolithography alignment is completed.

However, the unit cost of the device required by the bottom alignment technology is relatively high, and fragmentation is prone to occur in the process of processing thin wafers, and the yield of products is low.

SUMMARY

The present disclosure provides an alignment method for a backside photolithography process. The alignment method is not limited by thickness and materials of the wafer, and reduces secondary expense of the photolithography device. Meanwhile, the alignment method can reduce the probability of appearing thin wafers fragments in the photolithography process and effectively improve the yield of products.

In order to solve the above technical problems, a technical solution adopted in the present disclosure is to provide an alignment method for a wafer back photolithography process. The alignment method includes:
cutting a wafer, and marking at least two edges formed by the cutting as first alignment marks;
bonding a front side of the wafer with a pad to form a composite wafer; and
aligning the first alignment marks on the composite wafer with corresponding second alignment marks on a photomask for backside photolithography.

Said cutting the wafer, and marking at least two edges formed by the cutting as the first alignment marks includes: providing the wafer; setting at least two preset cutting lines on a surface of the wafer on which a pattern is etched; and cutting along the at least two preset cutting line, and marking the at least two edges formed by the cutting as the first alignment marks.

Setting at least two preset cutting lines on a surface of the wafer on which a pattern is etched includes: acquiring a plurality of distance reference values, wherein each of the plurality of distance reference value is a vertical distance value from a first preset position of a pattern on the photomask to the second alignment marks; and taking a second preset position as a starting point, determining the plurality of cutting points on the wafer according to a plurality of reference distances, and then connecting the plurality of cutting points to form the at least two preset cutting lines; wherein, the second preset position is a position of the pattern on the wafer corresponding to the first preset position.

The at least two preset cutting lines are two preset cutting lines. Each of the two preset cutting lines is continuous straight line or a discontinuous straight line, and the two preset cutting lines are perpendicular to each other.

The second alignment marks are arranged around the pattern on the photomask, and the at least two preset cutting line are arranged according to a peripheral edge of the second alignment marks.

The pad has a size not smaller than a size of a standard wafer.

The wafer is made of a material selected from the silicon, germanium, gallium arsenide, or indium phosphide. The pad is a silicon chip substrate, a sapphire substrate, or a gallium arsenide substrate.

The wafer has a thickness not more than 150 μm.

The wafer is bonded to the pad by temporary bonding glue.

The alignment method further includes after said aligning the first alignment marks on the composite wafer with corresponding second alignment marks on a photomask for backside photolithography: dissociating the wafer from the pad.

In the alignment method for the wafer backside photolithography process provided by the present disclosure, the wafer is cut, at least two edges formed by the cutting are used as the first alignment marks; the front side of the wafer is then bonded with the pad to form the composite wafer; finally, the first alignment marks on the composite wafer are aligned with the corresponding second alignment marks on the photomask for backside photolithography. Since the method uses at least two edges formed by the cutting as the first alignment marks, in the specific implementation process, the first alignment marks are only required to be aligned with the corresponding second alignment marks on the photomask. Compared with the alignment method using infrared double-side alignment technology and bottom alignment technology in the related art, the present disclosure does not require infrared rays to penetrate the wafer to map the pattern on the front side of the wafer to the backside of the wafer, and does not require to provide a camera under the photomask to collect the patterns on the photomask and the patterns on the front side of the wafer, such that the above alignment method of the present disclosure is not limited by thickness and materials of the wafer, is widely used, and effectively reduces secondary investment of the backside photolithography device. In addition, by bonding the cut wafer to the pad, the probability of appearing thin wafers fragments in the photolithography process can be reduced and the yield of products can be substantially improved.

BRIEF DESCRIPTION OF THE DRAWINGS

FIG. 6 is a structural schematic diagram of the backside of a wafer shown in FIG. 5 according to an embodiment of the present disclosure;

FIG. 7 is a structural schematic diagram of the backside of a wafer corresponding to FIG. 4 after photolithography according to an embodiment of the present disclosure;

FIG. 8 is a flowchart of step S101 shown in FIG. 3 according to an embodiment of the present disclosure.

DESCRIPTION OF EMBODIMENTS

Figure 1:
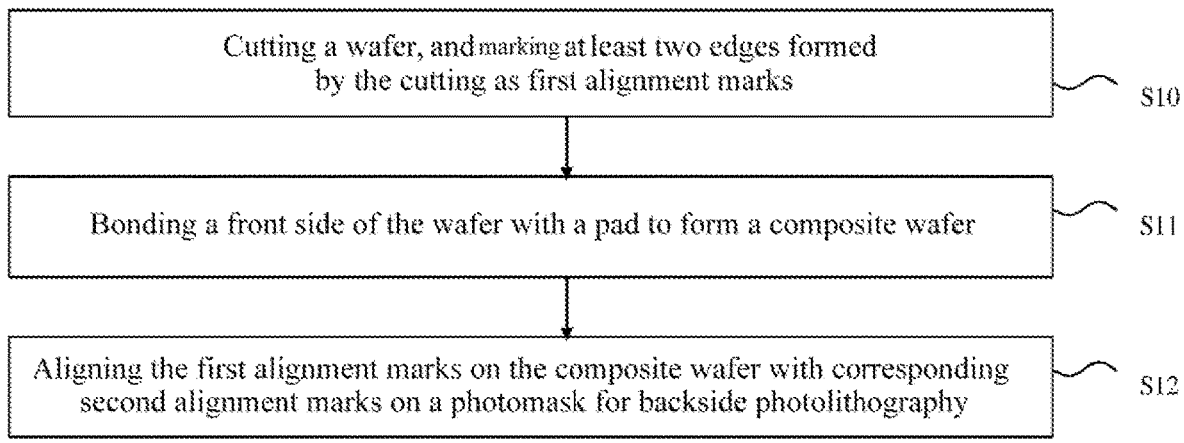
FIG. 1 is a flowchart of an alignment method for a wafer backside photolithography process according to an embodiment of the present disclosure.

The technical solutions in the embodiments of the present disclosure will be clearly and completely described below in conjunction with the accompanying drawings in the embodiments of the present disclosure. Obviously, the described embodiments are only a part of the embodiments of the present disclosure, rather than all the embodiments. Based on the embodiments of the present disclosure, all other embodiments obtained by those of ordinary skill in the art without creative work shall fall within the protection scope of the present disclosure.

The terms "first", "second", and "third" in the present disclosure are only used for descriptive purposes, and cannot be understood as indications or implications of its relative importance or implicitly indication of the number of technical features indicated. Thus, the features defined with "first", "second", and "third" may explicitly or implicitly include at least one of the features. In the description of the present disclosure, "a plurality of" means at least two, such as two, three, etc., unless otherwise defined. All directional indicators (such as up, down, left, right, front, back . . . ) in the embodiments of the present disclosure are only used to explain the relative positional relationship (as shown in the drawing), movement status of various components in a specific posture. If the specific posture is changed, the directional indication may also be changed accordingly. In addition, the terms "including" and "having" and any variations thereof are intended to cover non-exclusive inclusions. For example, processes, methods, systems, products, or devices that include a series of steps or units are not limited to the listed steps or units, but optionally includes unlisted steps or units, or optionally also includes other steps or units inherent in these processes, methods, products or devices.

Reference to "embodiments" herein means that a specific feature, structure, or characteristic described in conjunction with the embodiments can be included in at least one embodiment of the present disclosure. The appearance of the phrase in various places in the specification does not necessarily refer to the same embodiment, nor is it an independent or alternative embodiment mutually exclusive with other embodiments. Those skilled in the art can clearly and implicitly understand that the embodiments described herein can be combined with other embodiments.

The present disclosure will be described in detail below with reference to the drawings and embodiments.

Figure 2:
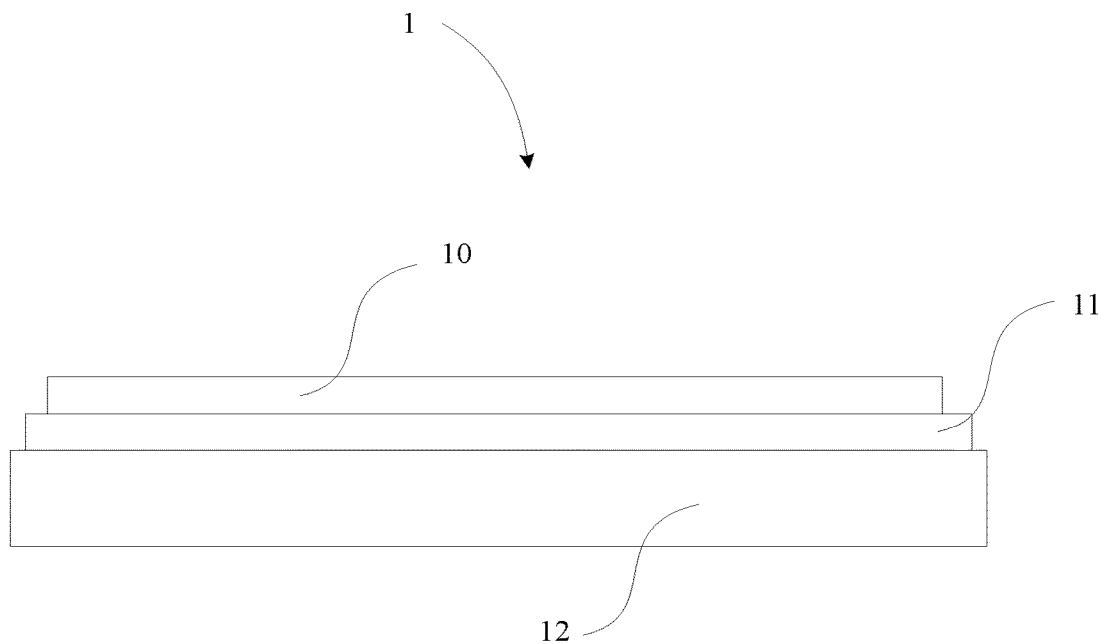
FIG. 2 is a structural schematic diagram of the product corresponding to step S11 shown in FIG. 1 according to an embodiment of the present disclosure.

Referring to FIG. 1 to FIG. 2, FIG. 1 is a flowchart of an alignment method for a wafer backside photolithography process according to an embodiment of the present disclosure; and FIG. 2 is a structural schematic diagram of the product corresponding to step S11 shown in FIG. 1 according to an embodiment of the present disclosure.

In this embodiment, an alignment method for a wafer backside photolithography process is provided. The alignment method can be applied to perform an ordinary front-side alignment operation on a photolithography machine, which not only can realize the backside alignment photolithography of the wafer, but also can reduce secondary expense of the photolithography device. The alignment method includes following steps.

In step S10, a wafer is cut, and at least two edges formed by the cutting are used as first alignment marks.

Optionally, the material of the wafer 10 may be silicon. It can be appreciated that, in other embodiments, the wafer 10 may also be made of germanium, gallium arsenide, or indium phosphide, which is not limited in the embodiments.

Optionally, the thickness of the wafer 10 is not more than 150 μm. It can be appreciated that, in other embodiments, the thickness of the wafer 10 may also be more than 150 μm, which is not limited in the embodiments.

It can be understood that the alignment method provided in the present disclosure uses at least two edges formed by cutting as the first alignment marks. In the specific implementation process, the first alignment marks are only required to be aligned with the corresponding second alignment marks on the photomask. Compared with the alignment method using infrared double-side alignment technology and bottom alignment technology in the related art, the present disclosure does not require infrared rays to penetrate the wafer 10 to map the pattern on the front side of the wafer 10 to the backside of the wafer 10, and does not require to provide a camera under the photomask to collect the patterns on the photomask and the patterns on the front side of the wafer 10, such that the above alignment method of the present disclosure is not limited by thickness and materials of the wafer 10, is widely used, and effectively reduces secondary expense of the backside photolithography device.

In step S11: a front side of the wafer is bonded with a pad to form a composite wafer.

It should be noted that, in the present disclosure, a surface at a side of the wafer 10 that etches a pattern is a front side of the wafer 10, and a surface at a side of the wafer 10 without the pattern, that is, the surface at a side of the wafer 10 to be processed, is the backside of the wafer 10.

In step S11, the patterned surface of the wafer 10 is bonded to a pad 12 through an adhesive to form a composite wafer 1. The specific structure of the composite wafer 1 can be seen in FIG. 2. In an embodiment, the composite wafer 1 includes a wafer 10, an adhesive layer 11 and a pad 12.

Optionally, the pad 12 may be a silicon chip substrate, a sapphire substrate or a gallium arsenide substrate.

Optionally, in an embodiment, the wafer 10 is bonded to the pad 12 by temporary bonding glue, and the size of the pad 12 is not smaller than the size of a standard wafer. It can be understood that the fully automatic photolithography device can only identify industry-standard wafers, and cannot identify non-circular wafer products whose partial structure has been cut. In the present disclosure, the wafer 10 after cutting is bonded to a round pad 12 having the same size as the standard wafer 10 or a pad 12 larger than the standard wafer 10 to compensate for the cut part of the wafer 10 by the pad 12, such that the wafer 10 provided in the method can meet the requirements of full automation device for the size of standard wafers so as to normally identify the wafer 10 provided in the method by the fully automated device and then process the wafer 10, but also can effectively reduce the probability of appearing thin wafers fragments in the photolithography process and effectively improve the yield of products.

In step S12: the first alignment marks on the composite wafer is aligned with corresponding second alignment marks on a photomask for backside photolithography.

In an embodiment, a conventional machine for front alignment photolithography is provided with a photomask with a pattern thereon. The second alignment marks are arranged around the pattern on the photomask, such that the first alignment marks are also arranged around the pattern on the wafer 10, thereby avoiding damage to the pattern on the front side of the wafer 10 during the cutting process.

In an embodiment, the second alignment marks can be multiple edges or letter patterns with edges, which are not limited in the embodiments, as long as the first alignment marks can align with the second alignment marks.

In the alignment method for the wafer backside photolithography process provided by the embodiments, the wafer 10 is cut, at least two edges formed by the cutting are used as the first alignment marks; the front side of the wafer 10 is then bonded with the pad 12 to form the composite wafer 1; finally, the first alignment marks on the composite wafer 1 are aligned with the corresponding second alignment marks on the photomask for backside photolithography. Since the method uses at least two edges formed by the cutting as the first alignment marks, in the specific implementation process, the first alignment marks are only required to be aligned with the corresponding second alignment marks on the photomask. Compared with the alignment method using infrared double-side alignment technology and bottom alignment technology in the related art, the present disclosure does not require infrared rays to penetrate the wafer 10 to map the pattern on the front side of the wafer 10 to the backside of the wafer 10, and does not require to provide a camera under the photomask to collect the patterns on the photomask and the patterns on the front side of the wafer 10, such that the above alignment method of the present disclosure is not limited by thickness and materials of the wafer 10, is widely used, and effectively reduces secondary investment of the backside photolithography device. In addition, by bonding the cut wafer 10 to the pad 12, the probability of appearing thin wafers fragments in the photolithography process can be reduced and the yield of products can be substantially improved.

Figure 3:
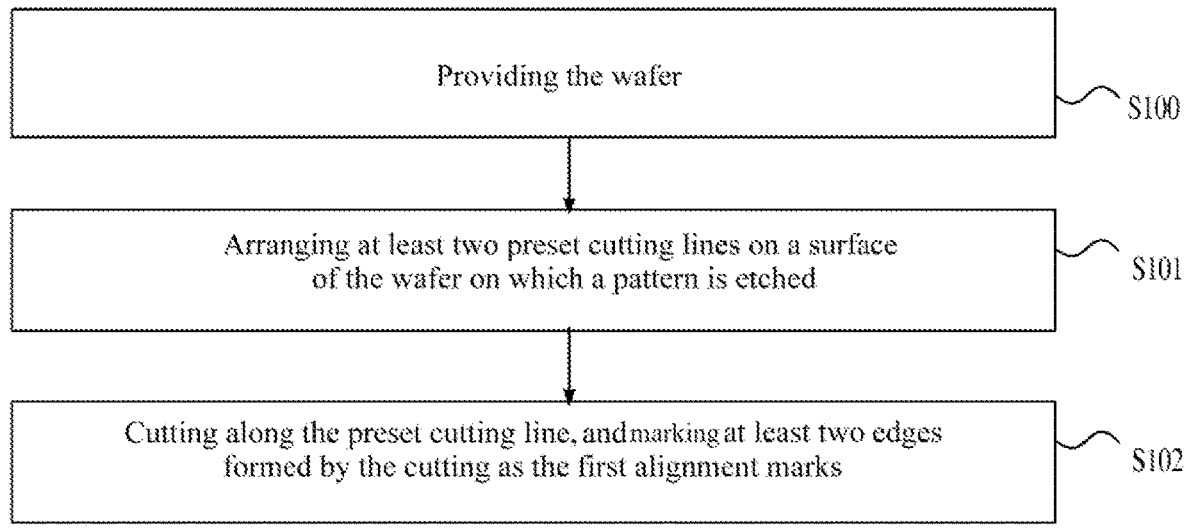
FIG. 3 is a schematic diagram of a flow of step S10 shown in FIG. 1 according to an embodiment of the present disclosure.
Figure 4:
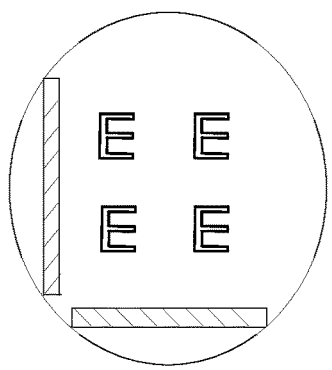
FIG. 4 is a structural schematic diagram of the front side of a wafer according to an embodiment of the present disclosure.
Figure 5:
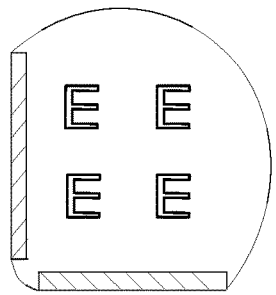
FIG. 5 is a structural schematic diagram of the front side of a wafer after cutting according to an embodiment of the present disclosure.

Referring to FIG. 3 to FIG. 4, FIG. 3 is a schematic diagram of a flow of step S10 shown in FIG. 1 according to an embodiment of the present disclosure, and FIG. 4 is a structural schematic diagram of the front side of a wafer according to an embodiment of the present disclosure. FIG. 5 is a structural schematic diagram of the front side of a wafer after cutting according to an embodiment of the present disclosure, and FIG. 6 is a structural schematic diagram of the backside of a wafer shown in FIG. 5 according to an embodiment of the present disclosure.

In this embodiment, unlike the above first embodiment, step S10 includes following steps.

In step S100: the wafer is provided.

In an embodiment, the wafer 10 has a circular structure, the front side of the wafer 10 is etched with patterns, and the backside of the wafer 10 has no pattern.

In step S101: at least two preset cutting lines are arranged on a surface of the wafer on which a pattern is etched.

In an embodiment, the structure of the front side of the wafer 10 after being processed in step S101 can be seen in FIG. 4.

Optionally, in order to facilitate cutting the wafer 10 while forming the first alignment marks, in an embodiment, two preset cutting lines perpendicular to each other can be set. In an embodiment, in order to improve cutting accuracy, the two preset cutting lines can be continuous straight lines. It can be appreciated that, in other embodiments, the two preset cutting lines may also be discontinuous straight lines, or are not perpendicular to each other.

In step S102: cutting is performed along the preset cutting line, and at least two edges formed by the cutting are used as the first alignment marks.

In an embodiment, the structures of the front side and the backside of the wafer 10 after being processed in step S102 can be referred to FIG. 5 and FIG. 6. In this embodiment, after performing aligning through the alignment method provided in the present disclosure and then performing photolithography, the structure of the obtained product can be seen in FIG. 7. FIG. 7 is a structural schematic diagram of the backside of a wafer corresponding to FIG. 4 after photolithography according to an embodiment of the present disclosure.

Optionally, in a specific cutting process, generally, a split is scribed along a preset cutting line by a wafer scriber, and then is split by a splitting machine to form at least two edges as the first alignment marks. It can be appreciated that, in other embodiments, it can be directly cut by a rotating grinding wheel blade or cut by laser light, which can be selected according to the material of the wafer 10 to be processed, which is not limited in the embodiments.

Referring to FIG. 8, FIG. 8 is a flowchart of step S101 shown in FIG. 3 according to an embodiment of the present disclosure. In this embodiment, unlike the above second embodiment, step S101 includes following steps.

In step S200: a plurality of distance reference values is acquired, the distance reference value is a vertical distance value from a first preset position of the pattern on the photomask to the second alignment marks.

In an embodiment, a plurality of distance reference values can be vertical distances from the first preset position in different directions of the pattern on the photomask to the second alignment marks.

In an embodiment, three distance reference values can be set. The three distance reference values are the vertical distances from three points on the edge of the pattern on the photomask in different directions to the second alignment marks.

In an embodiment, firstly, the pattern on the photomask and the second alignment marks can be mapped onto a plane, and then values of vertical distance from the edge of the corresponding pattern on the photomask on the plane to the second alignment marks are measured to obtain a distance reference value.

In step S201: a plurality of cutting points on the wafer is determined by taking the second preset position as a starting point based on a plurality of distance reference values, and then the plurality of cutting points is connected to form at least two preset cutting lines. The second preset position is a position of the pattern on the wafer corresponding to the first preset position.

It should be noted that the selection of the position of the preset cutting line also needs to consider avoiding pattern regions. It is best to set the preset cutting line in an edge region.

Exemplarily, the steps S200 to S201 will be described below in conjunction with a specific embodiment.

Assumed that A, B, and C of the pattern on the photomask are selected as the first preset positions, then the vertical distances from A, B, and C to the second alignment marks are measured respectively to obtain three distance reference values m, n, K. Then taking A', B', C' of the pattern on the wafer 10 corresponding to the positions of A, B, and C as the second preset positions, when A' is used as a starting point, the cutting point corresponding to A' is determined according to the distance reference value m; when B' is used as a starting point, the cutting point corresponding to B' is determined according to the distance reference value n; when C' is used as a starting point, the cutting point corresponding to C' is determined according to the distance reference value k. Then the three cutting points are connected together by continuous straight lines or discontinuous straight lines to form at least two cutting lines.

In an embodiment, the preset cutting line can be arranged using conventional gluing and developing processes.

Figure 9:
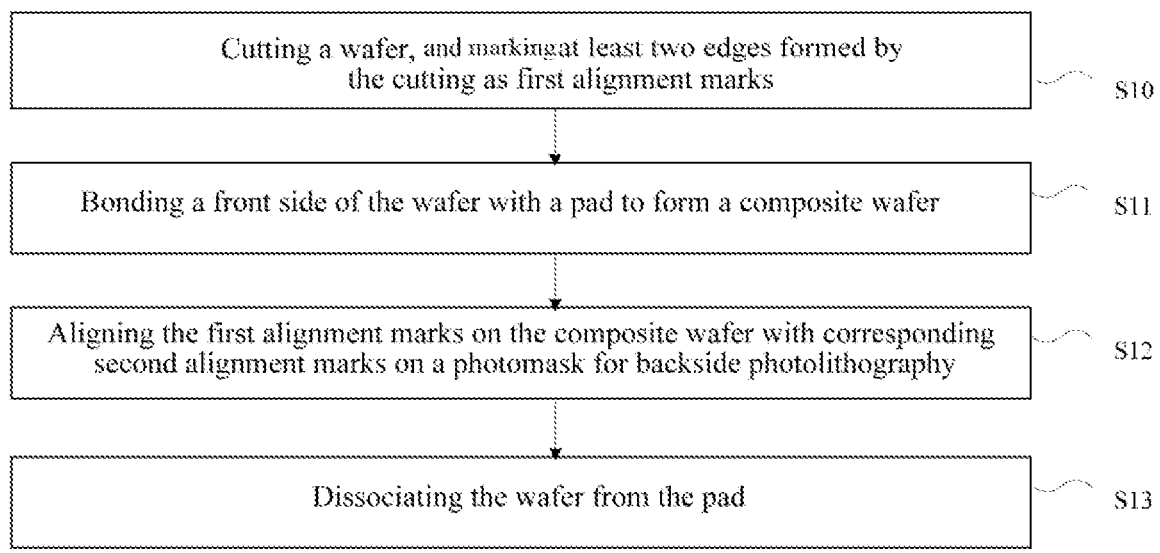
FIG. 9 is a flowchart of an alignment method for a wafer backside photolithography process according to another embodiment of the present disclosure.

Referring to FIG. 9, FIG. 9 is a flowchart of an alignment method for a wafer backside photolithography process according to another embodiment of the present disclosure. Unlike the above third embodiment, in this embodiment, after step S12, the method includes step S13.

In step S13: the wafer is dissociated from the pad.

It can be understood that in a specific implementation process, the wafer 10 can be dissociated from the composite wafer 1 according to requirements of later processes. In an embodiment, the adhesive layer 11 can be liquefied by heating the composite wafer 1, such that the wafer 10 is dissociated from the pad 12.

It can be understood that, in other embodiments, the composite wafer can be placed in a dissociation liquid, such that the adhesive is softened in the dissociation liquid, and the wafer 10 is dissociated from the pad 12. In this method, it should be noted that the dissociation fluid should not react with the wafer body and the pad.

The above are merely some embodiments of the present disclosure, which, as mentioned above, are not intended to limit the present disclosure. Any equivalent structure or equivalent process transformation made by using the content of the description and drawings of the present disclosure which are directly or indirectly applied to other related art shall fall into the protection scope of the present disclosure.

What is claimed is:

1. An alignment method for a wafer backside photolithography process, comprising:
    cutting a wafer to form at least two edges serving as first alignment marks;
    bonding a front side of the wafer with a pad, to form a composite wafer; and
    aligning the first alignment marks on the composite wafer with second alignment marks on a photomask corresponding to the first alignment marks, respectively, to perform backside photolithography,
    wherein said cutting the wafer to form at least two edges serving as the first alignment marks comprises:
    providing a wafer; and
    setting at least two preset cutting lines on a surface of the wafer on which a pattern is etched;
    said setting at least two preset cutting lines on a surface of the wafer on which a pattern is etched comprises:
    acquiring a plurality of distance reference values, wherein each of the plurality of distance reference values is one vertical distance of vertical distances from one first preset position of first preset positions of a pattern on the photomask to one second alignment mark of the second alignment marks; and
    determining a plurality of cutting points on the wafer based on the plurality of distance reference values, the vertical distances, and second preset positions taken as starting points of the vertical distances; and then connecting the plurality of cutting points to form the at least two preset cutting lines; wherein the second preset position is a position of the pattern on the wafer corresponding to the first preset position.

2. The alignment method for the wafer backside photolithography process according to claim 1, wherein
    said cutting the wafer to form at least two edges serving as the first alignment marks further comprises:
    cutting along the at least two preset cutting lines to form the at least two edges serving as the first alignment marks.

3. The alignment method for the wafer backside photolithography process according to claim 2, wherein
    the at least two preset cutting lines are two preset cutting lines; and
    each of the two preset cutting lines is a continuous straight line or a discontinuous straight line, and the two preset cutting lines are perpendicular to each other.

4. The alignment method for the wafer backside photolithography process according to claim 1, wherein
    the second alignment marks are arranged around the pattern on the photomask, and the at least two preset cutting lines are arranged based on a peripheral edge of the second alignment marks.

5. The alignment method for the wafer backside photolithography process according to claim 1, wherein the pad has a size not smaller than a size of a standard wafer.

6. The alignment method for the wafer backside photolithography process according to claim 1, wherein
    the wafer is made of a material selected from silicon, germanium, gallium arsenide, or indium phosphide; and
    the pad is a silicon chip substrate, a sapphire substrate, or a gallium arsenide substrate.

7. The alignment method for the wafer backside photolithography process according to claim 1, wherein the wafer has a thickness not more than 150 μm.

8. The alignment method for the wafer backside photolithography process according to claim 1, wherein the wafer is bonded to the pad by temporary bonding glue.

9. The alignment method for the wafer backside photolithography process according to claim 1, further comprising:
   after said aligning the first alignment marks on the composite wafer with second alignment marks on a photomask corresponding to the first alignment marks, respectively, to perform backside photolithography, dissociating the wafer from the pad.

\* \* \* \* \*